United States Patent [19]

Smothers

[11] Patent Number: 5,332,819

[45] Date of Patent: Jul. 26, 1994

[54] PHOTOBLEACHABLE INITIATOR SYSTEMS

[75] Inventor: William K. Smothers, Hockessin, Del.

[73] Assignee: E.I. Du Pont de Nemours and Company, Wilmington, Del.

[21] Appl. No.: 39,560

[22] Filed: Mar. 19, 1993

Related U.S. Application Data

[62] Division of Ser. No. 714,224, Jun. 11, 1991, Pat. No. 5,217,846.

[51] Int. Cl.$^5$ .................. C07D 451/04; C07D 401/04
[52] U.S. Cl. ...................... 546/94; 546/196; 546/197; 546/198; 546/199; 546/201
[58] Field of Search ................ 546/94, 196, 197, 198, 546/199, 201

[56] References Cited

U.S. PATENT DOCUMENTS

| | | | |
|---|---|---|---|
| 4,535,052 | 8/1985 | Anderson et al. | 430/920 X |
| 4,755,450 | 7/1988 | Sanders et al. | 430/285 |
| 4,917,977 | 4/1990 | Smothers | 430/1 |
| 4,987,057 | 1/1991 | Kaji et al. | 430/281 |
| 4,987,230 | 1/1991 | Monroe | 546/94 |

*Primary Examiner*—Johann Richter

[57] ABSTRACT

This invention relates to photopolymerizable compositions containing initiator systems that absorb in the longer wavelength region of the visible spectrum. Photopolymerizable compositions containing selected photodissociable initiators in combination with photobleachable sensitizers are disclosed.

16 Claims, No Drawings

PHOTOBLEACHABLE INITIATOR SYSTEMS

This is a division of application Ser. No. 07/714,224, filed Jun. 11, 1991 now U.S. Pat. No. 5,217,846.

FIELD OF THE INVENTION

This invention relates to photopolymerizable compositions containing initiator systems that absorb in the longer wavelength region of the visible spectrum. More particularly, this invention pertains to photopolymerizable compositions containing selected photodissociable initiators in combination with photobleachable sensitizers.

BACKGROUND OF THE INVENTION

The use of photoinitiator systems to initiate photopolymerization is well known. When irradiated by actinic radiation, the photoinitiator system generates free radicals, which initiate polymerization of the monomer or monomers. The photoinitiator system may be a single compound which absorbs actinic radiation and forms the initiating radicals, or it may consist of several different materials that undergo a complex series of reactions to produce radicals. Added components, known as coinitiators, which do not absorb actinic radiation, but which increase the efficiency of the photoinitiator system, may also be present.

Many of the well-known photoinitiator systems have limited applicability because they are activated only by ultraviolet radiation. The availability of reliable, relatively inexpensive, visible lasers, which can expose the photopolymer directly, eliminating the intermediate photomask, has made it essential that initiator systems which can be activated by visible radiation be developed. Applications for photopolymerizable compositions which are sensitive to visible radiation include: graphic arts films, proofing, printing plates, photoresists, and solder masks.

A large number of free-radical generating systems have been used as visible sensitizers for photopolymerizable compositions. Photoreducible dyes with various coinitiators have been widely studied. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427-487. However, many dye sensitized systems undergo dark reactions and are not shelf stable.

The preparation of holograms in photopolymerizable compositions, such as are disclosed in Haugh, U.S. Pat. No. 3,658,526; Keys, U.S. Pat. No. 4,942,102; Monroe, U.S. Pat. No. 4,942,112; Smothers, U.S. Pat. No. 4,959,284; and Trout, U.S. Pat. No. 4,963,471, require initiator systems which can be activated by visible radiation. However, it is desirable that, following imaging, the hologram not be colored by sensitizer, or its reaction products. The sensitizer must be colored to absorb actinic radiation and initiate photopolymerization, but must be photobleachable so that no colored products remain following imaging.

Photopolymerizable compositions containing 2,2',4,4',5,5'-hexaarylbisimidazoles, or HABI's, are well known. Sensitizers that extend the sensitivity of these compositions are disclosed in a number of patents. Baum and Henry, U.S. Pat. No. 3,652,275, discloses photopolymerizable compositions containing selected bis(p-dialkylaminobenzylidene)ketones as sensitizers of HABI initiator systems. Dueber, U.S. Pat. No. 4,162,162, discloses selected sensitizers derived from aryl ketones and p-dialkylaminoaldehydes. Smothers, U.S. Pat. No. 4,917,977, and Monroe, U.S. Pat. No. 4,987,230, also disclose visible sensitizers for HABI. However, these sensitizers can leave undesirable residual color in the hologram following imaging.

A need exists for initiator systems that are sensitive to visible radiation, especially in the green and red regions of the spectrum, but do not leave residual color in the image following imaging. These photobleachable initiator systems will be particularly useful in holography, pre-press color proofing, and in other applications in which an image with no residual color is desired.

SUMMARY OF THE INVENTION

In one embodiment this invention is photopolymerizable composition comprising at least one ethylenically unsaturated monomer capable of free radical initiated addition polymerization and an initiator system activatible by actinic radiation, wherein said initiator system comprises a hexaarylbisimidazole, a coinitiator, and a sensitizer, the improvement wherein comprising said sensitizer is a compound of structure:

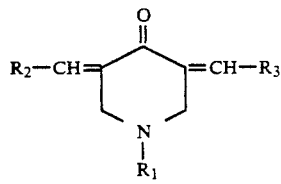

wherein
$R_1$ is (1) hydrogen, (2) substituted or unsubstituted alkyl of 1 to 8 carbon atoms, or (3) $R_{15}CO-$, where
$R_{15}$ is a substituted or unsubstituted aryl or heteroaryl of 5 to 10 atoms or a substituted or unsubstituted alkyl containing i to 8 carbon atoms; and $R_2$ and $R_3$, alike or different, are selected from the group consisting of:

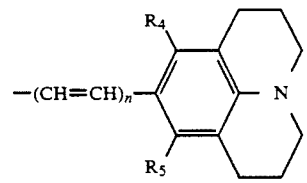

wherein:
n is 0 or 1;
$R_4$ and $R_5$ are each independently hydrogen, hydroxyl, halogen, alkyl of 1 to 6 carbon atoms, and alkoxyl of 1 to 6 carbon atoms; and,

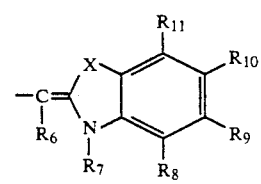

wherein:

X is O, S, Se, NR$_{12}$, or CR$_{13}$R$_{14}$, where R$_{12}$, R$_{13}$, and R$_{14}$ are each independently alkyl of 1 to 6 carbon atoms or substituted or unsubstituted phenyl;

R$_6$ is hydrogen or substituted or unsubstituted alkyl of 1 to 4 carbon atoms;

R$_7$ is (1) substituted or unsubstituted alkyl or cycloalkyl of 1 to 8 carbon atoms or (2) substituted or unsubstituted aryl or heteroaryl of 5 to 10 atoms; or R$_6$ and R$_7$ are Joined together to form a 5- to 7-membered substituted or unsubstituted heterocyclic ring;

R$_8$, R$_9$, R$_{10}$, and R$_{11}$ each independently hydrogen, halogen, dialkylamino, substituted or unsubstituted alkyl or cycloalkyl of 1 to 6 carbon atoms, or substituted or unsubstituted alkoxyl of 1 to 6 carbon atoms; or (R$_8$ and R$_9$), (R$_9$ and R$_{10}$), or (R$_{10}$ and R$_{11}$) are joined in a substituted or unsubstituted aromatic ring of 5 to 10 atoms.

In a preferred embodiment of this invention, R$_2$ and R$_3$ are the same. In another preferred embodiment of this invention, the photopolymerizable composition additionally comprises a binder.

In another embodiment this invention is compound suitable for use as a photobleachable sensitizer having the following structure:

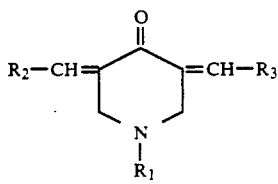

wherein

R$_1$ is (1) hydrogen, (2) substituted or unsubstituted alkyl of 1 to 8 carbon atoms, or (3) R$_{15}$CO—, where R$_{15}$ is a substituted or unsubstituted aryl or heteroaryl of 5 to 10 atoms or a substituted or unsubstituted alkyl containing 1 to 8 carbon atoms; and R$_2$ and R$_3$, alike or different, are selected from the group consisting of:

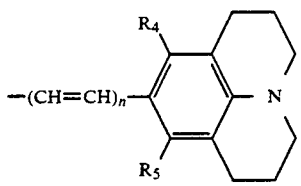

wherein:
n is 0 or 1;
R$_4$ and R$_5$ are each independently hydrogen, hydroxyl, halogen, alkyl of 1 to 6 carbon atoms, and alkoxyl of 1 to 6 carbon atoms; and

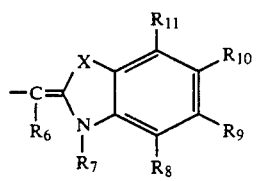

wherein:

X is O, S, Se, NR$_{12}$, or CR$_{13}$R$_{14}$, where R$_{12}$, R$_{13}$, and R$_{14}$ are each independently alkyl of 1 to 6 carbon atoms or substituted or unsubstituted phenyl;

R$_6$ is hydrogen or substituted or unsubstituted alkyl of 1 to 4 carbon atoms;

R$_7$ is (1) substituted or unsubstituted alkyl or cycloalkyl of 1 to 8 carbon atoms or (2) substituted or unsubstituted aryl or heteroaryl of 5 to 10 atoms; or R$_6$ and R$_7$ are joined together to form a 5- to 7-membered substituted or unsubstituted heterocyclic ring;

R$_8$, R$_9$, R$_{10}$, and R$_{11}$ each independently hydrogen, halogen, dialkylamino, substituted or unsubstituted alkyl or cycloalkyl of 1 to 6 carbon atoms, or substituted or unsubstituted alkoxyl of 1 to 6 carbon atoms; or (R$_8$ and R$_9$), (R$_9$ and R$_{10}$), or (R$_{10}$ and R$_{11}$) are joined in a substituted or unsubstituted aromatic ring of 5 to 10 atoms.

In a preferred embodiment of this invention, R$_2$ and R$_3$ are the same.

DETAILED DESCRIPTION OF THE INVENTION

Photopolymerizable Compositions

The novel compositions of this invention are photopolymerizable compositions in which polymerization is initiated by free radicals generated by actinic radiation. These compositions comprise a sensitizer; a hexaarylbisimidazole; a polymerizable monomer; a coinitiator; and, optionally, a binder. The composition may also comprise other ingredients which are conventional components of photopolymerizable systems, such as stabilizers, antihalation agents, coating aids, and the like.

Sensitizers

The sensitizers of this invention are compounds of the following structure:

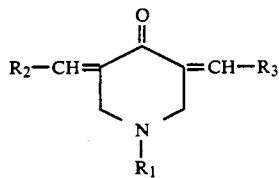

wherein

R$_1$ is (1) hydrogen, (2) substituted or unsubstituted alkyl of 1 to 8 carbon atoms, or (3) R$_{15}$CO—, where R$_{15}$ is a substituted or unsubstituted aryl or heteroaryl of 5 to 10 atoms or a substituted or unsubstituted alkyl containing 1 to 8 carbon atoms; and R$_2$ and R$_3$, alike or different, are selected from the group consisting of:

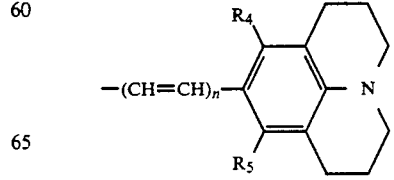

wherein:

n is 0 or 1;

$R_4$ and $R_5$ are each independently hydrogen, hydroxyl, halogen, alkyl of 1 to 6 carbon atoms, and alkoxyl of 1 to 6 carbon atoms; and

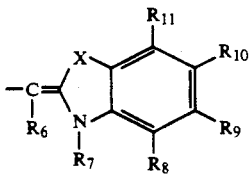

wherein:

X is O, S, Se, $NR_{12}$, or $CR_{13}R_{14}$, where $R_{12}$, $R_{13}$, and $R_{14}$ are each independently alkyl of 1 to 6 carbon atoms or substituted or unsubstituted phenyl;

$R_6$ is hydrogen or substituted or unsubstituted alkyl of 1 to 4 carbon atoms;

$R_7$ is (1) substituted or unsubstituted alkyl or cycloalkyl of 1 to 8 carbon atoms or (2) substituted or unsubstituted aryl or heteroaryl of 5 to 10 atoms; or $R_6$ and $R_7$ are joined together to form a 5- to 7-membered substituted or unsubstituted heterocyclic ring;

$R_8$, $R_9$, $R_{10}$, and $R_{11}$ each independently hydrogen, halogen, dialkylamino, substituted or unsubstituted alkyl or cycloalkyl of 1 to 6 carbon atoms, or substituted or unsubstituted alkoxyl of 1 to 6 carbon atoms; or ($R_8$ and $R_9$), ($R_9$ and $R_{10}$), or ($R_{10}$ and $R_{11}$) are joined in a substituted or unsubstituted aromatic ring of 5 to 10 atoms.

Wherein substitution is possible, any of the groups present in the sensitizer may be substituted by any of the well known substituents, provided the presence of the substituent does not adversely affect the properties of the sensitizer required for the operation of the initiator system or the photopolymerizable composition, such as, for example, solubility, stability, electronic properties, absorption spectrum, etc. Such substituents include, for example: alkyl, such as, for example, methyl, ethyl, i-propyl, etc.; substituted alkyl, such as, for example, trifluoromethyl, trichloromethyl, benzyl, etc.,; hydroxyl; alkoxy, for example, methoxy, ethoxy, etc.; thioalkoxy, such as, for example, thiomethyl, etc.; phenoxy; thiophenoxy; formyl, acetyl, benzoyl, etc.; carboxy, methylcarboxy, ethylcarboxy, etc.; halogen, such as fluoro, chloro, bromo, iodo; cyano; isocyano; nitro; sulfonyl; amino; amido, such as, for example, ethylamido, etc.; alkylamino, such as, for example, ethylamino, etc.; dialkylamino, such as, for example, dimethylamino, diethylamino, etc.; and the like. These groups may unsubstituted or may be substituted as described above. The presence of the substituent should not significantly inhibit polymerization of the monomer.

$R_1$ may be hydrogen, or alkyl or cycloalkyl of one to eight carbon atoms, such as, for example, methyl, ethyl, n-propyl, iso-butyl, n-hexyl, cyclopentyl, cyclohexyl, benzyl, etc. $R_1$ may also be aryl or heteroaryl of five to ten atoms, such as, for example, phenyl, naphthyl, pyridinyl, furanyl, thiophenyl, etc. $R_1$ may also be $R_{15}CO—$, where $R_{15}$ is an aromatic group of five to ten atoms or an alkyl group of 1 to 8 carbon atoms. These groups may be unsubstituted or may be substituted as described above. $R_1$ is preferably hydrogen, alkyl of one to seven carbon atoms, or $R_{15}CO—$, where $R_{15}$ is methyl or substituted or unsubstituted phenyl. $R_1$ is most preferably selected from the group consisting of hydrogen, methyl, ethyl, i-propyl, n-propyl, benzyl, acetyl, and benzoyl.

The sensitizers of this invention photobleach when exposed to actinic radiation. On exposure over 75% of the absorption at the wavelength of maximum absorption ($\lambda_{max}$) is lost. Under similar conditions comparison compounds lose less than 75% of the absorption at $\lambda_{max}$. Although not required for the practice of this invention, for ease of synthesis it is preferred that the sensitizers be symmetrical, so that $R_2$ and $R_3$ are the same.

In one group of preferred sensitizers, $R_2$ and $R_3$ are the same and equal to:

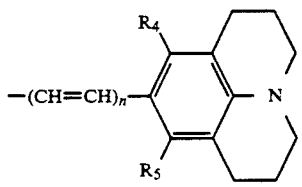

wherein:

n is 0 or 1;

$R_4$ and $R_5$ are each independently hydrogen, hydroxyl, halogen, alkyl of 1 to 6 carbon atoms, and alkoxyl of 1 to 6 carbon atoms.

Representative members of this group are sensitizers S-1, S-2, and S-3. In a more preferred group, n is 0. In an still more preferred group, $R_4$ and $R_5$ are the same and equal to hydrogen. Representative members of this group are sensitizers S-1 and S-2.

In another group of preferred sensitizers, $R_2$ and $R_3$ are the same and equal to:

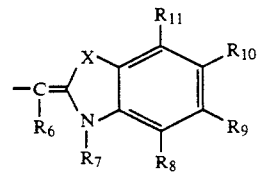

wherein:

X is O, S, Se, $NR_{12}$, or $CR_{13}R_{14}$, where $R_{12}$, $R_{13}$, and $R_{14}$ are each independently alkyl of 1 to 6 carbon atoms or substituted or unsubstituted phenyl;

$R_6$ is hydrogen or substituted or unsubstituted alkyl of 1 to 4 carbon atoms;

$R_7$ is (1) substituted or unsubstituted alkyl or cycloalkyl of 1 to 8 carbon atoms or (2) substituted or unsubstituted aryl or heteroaryl of 5 to 10 atoms; or $R_6$ and $R_7$ are joined together to form a 5- to 7-membered substituted or unsubstituted heterocyclic ring;

$R_8$, $R_9$, $R_{10}$, and $R_{11}$ each independently hydrogen, halogen, dialkylamino, substituted or unsubstituted alkyl or cycloalkyl of 1 to 6 carbon atoms, or substituted or unsubstituted alkoxyl of 1 to 6 carbon atoms; or ($R_8$ and $R_9$), ($R_9$ and $R_{10}$), or ($R_{10}$ and $R_{11}$) are joined in a substituted or unsubstituted aromatic ring of 5 to 10 atoms.

Representative members of this group are sensitizers S-4, S-5, S-6, S-7, S-8, S-9, S-10, S-11, and S-12. $R_7$ may be alkyl or cycloalkyl of one to eight carbon atoms, such as, for example, methyl, ethyl, n-propyl, iso-butyl, n-hexyl, cyclopentyl, cyclohexyl, benzyl, etc. $R_7$ may also be aryl or heteroaryl of five to ten atoms, such as, for example, phenyl, naphthyl, pyridinyl, furanyl, thiophenyl, etc. $R_7$ is preferably an alkyl group of 1 to 4 carbon atoms, more preferably methyl or ethyl. Alternatively, $R_6$ and $R_7$ are joined together to form a 5- to 7-membered heterocyclic ring. These groups may be unsubstituted or may be substituted as described above.

In one more preferred group of sensitizers, X is $C(CH_3)_2$. In a still more preferred group $R_6$, $R_8$, $R_9$, $R_{10}$, and $R_{11}$ are the same and equal to hydrogen and $R_7$ is alkyl of 1 to 4 carbon atoms. Representative members of this group are sensitizers S-4, S-5, S-6, S-7, and S-8. In another still more preferred group, $R_6$ and $R_7$ are joined to form a 6-membered heterocyclic ring and $R_8$, $R_9$, $R_{10}$, and $R_{11}$ are the same and equal to hydrogen. A representative member of this group is sensitizer S-9.

In another more preferred group, X is 0. In a still more preferred group $R_6$, $R_8$, $R_9$, R10, and $R_{11}$ are the same and equal to hydrogen and $R_7$ is alkyl of 1 to 4 carbon atoms. A representative member of this group is sensitizer S-10.

In another more preferred group, X is S. In a still more preferred group $R_6$, $R_8$, $R_9$, $R_{10}$, and $R_{11}$ are the same and equal to hydrogen and $R_7$ is alkyl of 1 to 4 carbon atoms. A representative member of this group is sensitizer S-11. In another still more preferred group $R_6$, $R_{10}$, and $R_{11}$ are the same and equal to hydrogen, $R_7$ is alkyl of 1 to 4 carbon atoms, and $R_8$ and $R_9$ are joined to form a 6-membered aromatic ring. A representative member of this group is sensitizer S-12.

The sensitizers of this invention may be used individually, in combination with other members of the same class of sensitizers, or with other photobleachable initiator system. In cases in which photobleaching is not required, they may be used with non-photobleachable initiator systems. The use of two or more such sensitizers or initiator systems effects sensitization over a broader spectral range of actinic radiation.

Hexaarylbisimidazoles

The sensitizers of this invention are used in conjunction with a 2,2',4,4',5,5'-hexaarylbisimidazole, or HABI. These compounds dissociate on exposure to actinic radiation to form the corresponding triarylimidazolyl free radicals. These compounds are described in: Chambers, U.S. Pat. No. 3,479,185; Cescon, U.S. Pat. No. 3,784,557; Dessauer, U.S. Pat. No. 4,252,887 and U.S. Pat. No. 4,311,783; Tanaka, U.S. Pat. No. 4,459,349; Wada, U.S. Pat. No. 4,410,621, and Sheets, U.S. Pat. No. 4,662,286. The hexaarylbisimidazoles absorb maximally in the 255-275 nm region of the spectrum, and usually show some, though lesser absorption in the 300-375 nm region. Although the absorption bands tend to tail out to include wavelengths as high as 430 nm, in the absence of a sensitizer these compounds normally require light rich in the 255-375 nm region of the spectrum for their dissociation.

A preferred class of hexaarylbisimidazoles are 2-o-chlorophenyl-substituted derivatives in which the other positions on the phenyl radicals are either unsubstituted or substituted with chloro, methyl or methoxy groups. More preferred are HABI's in which the other positions on the phenyl radicals are unsubstituted or substituted with one or more methoxy groups. Selected compounds of this class are disclosed in Dessauer, U.S. Pat. No. 4,252,887. Preferred HABI's include: o-Cl-HABI, 2,2'-bis (o-chlorophenyl)-4,4,'5,5'-tetraphenyl-1,1'-biimidazole; CDM-HABI, 2-(o-chlorophenyl)-4,5-bis (m-methoxyphenyl)-imidazole dimer; TCTM-HABI, 2,5-bis (o-chlorophenyl)-4-[3,4-dimethoxyphenyl]-1H-imidazole dimer; and TCDM-HABI, the product of the oxidative coupling of 2-(o-chlorophenyl)-4,5-diphenylimidazole and 2,4-bis- (o-chlorophenyl) -5-[3,4-dimethoxyphenyl]imidazole disclosed in Sheets, U.S. Pat. No. 4,662,286.

Coinitiators

Conventional chain transfer agents, or hydrogen donors, may be used used as coinitiators with HABI-initiated Photopolymerizable compositions. Suitable coinitiators include organic thiols, such as 2-mercaptobenzothiazole, 2-mercaptobenzoxazole, and 2-mercaptobenzimidazole. Others that can be used include various tertiary amines known in the art, N-phenylglycine, and 1, 1-dimethyl-3, 5 -diketocyclohexane. Except for systems that contain N-vinyl carbazole monomer, the preferred coinitiators are N-phenyl glycine, 2-mercaptobenzoxazole and 2-mercaptobenzthiazole. As disclosed in Smothers, U.S. Pat. No. 4,994,347, for photopolymerizable compositions which contain the monomer N-vinyl carbazole, the preferred coinitiators are: 5-chloro-2-mercaptobenzothiazole; 2-mercaptobenzothiazole; 1-H-1,2,4-triazole-3-thiol; 6-ethoxy-2-mercaptobenzothiazole; 4-methyl--4H-1,2,4-triazole-3-thiol; and 1-dodecanethiol.

Borate anions may also be used as coinitiators in HABI-initiated photopolymerizable compositions. When a borate anion is present, efficient photopolymerization is obtained, even in the absence of a chain transfer agent or hydrogen donor.

Borate anions useful as coinitiators are disclosed in Gottschalk, U.S. Pat. Nos. 4,772,530 and 4,772,541 and Koike, U.S. Pat. No. 4,950,581 . The borate anions are represented by the following general formula:

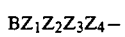

where $Z_1$, $Z_2$, $Z_3$, and $Z_4$, are independently selected from the group consisting of alkyl, aryl, aralkyl, alkenyl, alkynyl, heterocyclic, and allyl groups, with the proviso that at least one of $Z_1$, $Z_2$, $Z_3$, and $Z_4$ is not aryl.

Each group may contain up to twenty carbon atoms, but groups with about seven carbon atoms or less are preferred. The alkyl groups may be linear, branched or cyclic, and may be substituted or unsubstituted. Preferably, at least one, but not more than three, of $Z_1$, $Z_2$, $Z_3$, and $Z_4$ is an alkyl group. More preferred are anions in which $Z_1$-$Z_4$ is a combination of three aryl groups and one alkyl group. The phenyl and p-methoxyphenyl groups are preferred aryl groups. A preferred anion is triphenylbutyl borate.

If a borate anion is used as a coinitiator, it is preferred that the cation associated with the borate anion not absorb a significant amount of actinic radiation since this would decrease photospeed. Representative cations are alkali metal cations and quaternary ammonium cations.

Borate/Triazine Systems

The sensitizers of this invention may be used in initiator systems comprising a sensitizer, a borate anion, and an (alpha-halo)methyl s-triazine. The borate anions which may be used are described above. The triazine comprises at least one halogenated methyl group. Examples of triazines are given in Nagasaka, EPO Application 90/101,025, Bonham, U.S. Pat. No. 3,987,037, and Koibe, U.S. Pat. No. 4,810,618. A preferred triazine is 2,4,6-tris (trichloromethyl)-1,3,5-triazine.

Monomer/Binder

The composition contains at least one ethylenically unsaturated compound which undergoes free-radical initiated polymerization, generally known as a monomer. The composition contains at least one such material and may contain a mixture of such materials. In general, preferred monomers for phototopolymer applications have boiling points greater than 100° C, more preferably, greater than 150° C.

Typical monomers are: unsaturated esters of alcohols, preferably polyols, such as, diethylene glycol diacrylate, glycerol triacrylate, ethylene glycol dimethacrylate, pentaerythritol tri- and tetraacrylate and methacrylate; unsaturated amides, such 1,6-hexamethylene bis-acrylamide; vinyl esters such as divinyl succinate, divinyl phthalate, and divinyl benzene-1,3-disulfonate; styrene and derivatives thereof; and N-vinyl compounds, such as N-vinyl carbazole. Numerous other unsaturated monomers polymerizable by free-radical initiated polymerization and useful in photopolymerizable compositions are known to those skilled in the art. A list of representative monomers is given by Ishikawa, U.S. Pat. No. 4,481,276. For photoresist applications the preferred monomers are trimethylol propane triacrylate, the triacrylate ester of ethoxylated trimethylolpropane, tetraethylene glycol diacrylate, and tetraethylene glycol dimethacrylate. For peel-apart photosensitive elements adapted for the preparation of surprint proofs, useful monomers are epoxy monomers containing ethylenic unsaturation, such as are disclosed in U.S. Pat. No. 3,661,576. Preferred monomers are the diacrylate and dimethacrylate esters of the eptchlorohydrin adduct of bis-phenol A.

The binder is an optional component present in the preferred photopolymerizable compositions of this invention. The binder is a preformed macromolecular polymeric or resinous material. In general, the binder should be soluble, or at least swellable, in the coating solvent and compatible with the other components of the photopolymerizable system. Representative binders are poly(methyl methacrylate) and copolymers of methyl methacrylate with other alkyl acrylates, alkyl methacrylates, methacrylic acid, and/or acrylic acid; poly(vinyl acetate) and its partially hydrolyzed derivatives; gelatin; cellulose esters and ethers, such as cellulose acetate butyrate; and polyethylene oxides. Numerous other binders useful in photopolymerizable compositions are known to those skilled in the art. A list of representative binders is given by Ishikawa, U.S. Pat. No. 4,481,276.

For photoresist applications the preferred binders are copolymers of methyl methacrylate, ethyl acrylate, and methacrylic acid. Copolymers of methyl methacrylate, ethyl acrylate, and methacrylic acid copolymerized with a small amount of allyl methacrylate may also be used to advantage. For peel-apart photosensitive elements adapted for the preparation of surprint proofs, the binder can be a polar material, such as an acidic polymer containing at least 1.5 mole percent free acid groups to impart polarity to the polymer, or a nonpolar material, e.g., materials as described in Burg, U.S. Pat. No. 3,060,023; Chu, U.S. Pat. No. 3,649,268 and Collier, U.S. Pat. No. 3,984,244. Suitable binders include polymers of methyl acrylate, methyl methacrylate, and copolymers thereof. A preferred binder is poly(methyl methacrylate).

As disclosed in Keys, U.S. Pat. No. 4,942,102; Monroe, U.S. Pat. No. 4,942,112; Smothers, U.S. Pat. No. 4,959,284; and Trout, U.S. Pat. No. 4,963,471, in the preferred compositions adapted for the preparation of holograms, either the monomer or the binder contains one or more moieties selected from the group consisting of (1) an aromatic moiety selected from the group consisting of (i) substituted or unsubstituted phenyl, (ii) substituted or unsubstituted naphthyl, and (iii) substituted or unsubstituted heterocyclic aromatic moiety having up to three rings; (2) chlorine; (3) bromine and (4) mixtures thereof; and the other constituent is substantially free of said moiety. Compositions in which the monomer contains the indicated group and the binder is free of the indicated group are preferred.

For systems in which the monomer contains the indicated group and the binder is free of the indicated group preferred liquid monomers are: 2-phenoxyethyl acrylate, 2-phenoxyethyl methacrylate, phenol ethoxylate monoacrylate, 2-(p-chlorophenoxy) ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, ethyl 1-benzoyl-2-vinyl-1-cyclopropane carboxylate and mixtures thereof. Preferred solid monomers, which may be used in combination with liquid monomers are: N-vinyl carbazole; 2,4,6-tribromophenyl acrylate or methacrylate; pentachlorophenyl acrylate or methacrylate; 2-naphthyl acrylate or methacrylate; 2-(2-naphthyloxy)ethyl acrylate or methacrylate; and mixtures thereof. Preferred binders for use in these systems are: cellulose acetate butyrate; poly(methyl methacrylate); poly(vinyl butyral); poly(vinyl acetate); and fluorine containing binders containing 3 to 25% by weight fluorine, such as copolymers of vinyl acetate with tetrafluoroethylene and/or hexafluoropropylene. For reflection holograms, the preferred binders are poly(vinyl butyral), poly(vinyl acetate), and copolymers of vinyl acetate with tetrafluoroethylene and/or hexafluoropropylene containing 3 to 25% by weight fluorine, such the 82:18 (mole%) vinyl acetate/tetrafluoroethylene copolymer.

For systems in which the binder contains the indicated group and the monomer is free of the indicated group, preferred monomers are: triethyleneglycol diacrylate and dimethacrylate, diethyleneglycol diacrylate, decanediol diacrylate, ethoxyethoxyethyl acrylate, isobornyl acrylate, ethyl 1-acetyl-2-vinyl-1-cyclopropane carboxylate, ethyl 2-vinylcyclopropane-1,1-dicarboxylate and mixtures thereof. Preferred binders for these systems are: polystyrene and copolymers containing at least about 60% styrene. Particularly preferred binders include polystyrene, 75:25 poly(styrene/acrylonitrile), and 70:30 poly(styrene/methyl methacrylate), as well as mixtures thereof.

If crosslinking of the holographic photopolymer is desired, up to about five weight percent of at least one multifunctional monomer containing two or more terminal ethylenically unsaturated groups may be incorporated into the composition. The polyfunctional monomer must be compatible with the other components of the composition and is preferably a liquid. Suitable polyfunctional monomers include di-(2-acryloxyethyl)ether of bisphenol A, ethoxylated bisphenol A diacrylate, and the like. A preferred crosslinking is ethoxylated hisphenol A diacrylate.

Other Components

Other components conventionally added to Photopolymerizable compositions can be present to modify the physical properties of the film. Such components include: plasticizers, thermal stabilizers, optical brighteners, ultraviolet radiation absorbing materials, adhesion modifiers, coating aids, and release agents.

A plasticizer may be present to modify adhesion, flexibility, hardness, and other mechanical properties of the film in a conventional fashion. When a binder is present, a plasticizer would be selected which is compatible with the binder as well as the monomer and other components of the composition. With acrylic binders, for example, plasticizers can include dibutyl phthalate and other esters of aromatic acids; esters of aliphatic polyacids, such as diisooctyl adipate; aromatic or aliphatic acid esters of glycols, polyoxyalkylene glycols, aliphatic polyols; alkyl and aryl phosphates; and chlorinated paraffins. In general, water insoluble plasticizers are preferred for greater high humidity storage stability, but are not necessary to get improved latitude.

Many ethylenically unsaturated monomers are subject to thermal polymerization, especially when stored for long periods or at elevated temperatures. Normally a conventional thermal polymerization inhibitor will be present to improve the storage stability the photopolymerizable composition. The nitroso dimers described in Pazos, U.S. Pat. No. 4,168,982, are also useful. Since monomers generally contain thermal polymerization inhibitors added by their manufacturers, it is frequently unnecessary to add additional inhibitor.

Nonionic surfactants may be added to the photopolymerizable composition as coating aids. Typical coating aids are polyethylene oxides, such as Polyox® WSRN, coating aids and fluorinated nonionic surfactants, such as Fluorad® FC-430 and Fluorad® FC-431 surfasant.

Depending on the application, other inert additives can be employed such as dyes, pigments and fillers. These additives are generally present in minor amounts so as not to interfere with the exposure of the photopolymerizable layer.

Composition

While the composition of the photopolymerizable composition will depend on the intended application, when the composition is to be used as a dry film, in general, the binder should be at least about 25% and the monomer should not exceed about 60%, based on the total weight of the composition. If the amount of binder is below approximately 25%, or the amount of monomer exceeds approximately 60%, the composition has insufficient viscosity to form a solid film. While the amount of initiator system present will depend on the thickness of the layer and the desired optical density for the intended application, in general, about 0.1% to about 10% will be present.

Typical compositions are: binder(s) 25 to 90%, preferably 45 to 75%; monomer(s), 5 to 60%, preferably, 15 to 50%; plasticizer, 0 to 25%, preferably, 0 to 15%; photoinitiator system, 0.01 to 10%, preferably 0.1 to 5%; and other ingredients, 0 to 5%, typically 0 to 4%.

The amount of sensitizer present depends on the wavelength(s) of actinic radiation used for exposure, the absorption spectrum of the sensitizer, and the thickness of the photopolymer coating. As described by Thomroes and Webers, J. Imag. Sci., 29, 112 (1985), an optical density of 0.43 produces efficient photopolymerization for systems which are developed by washout, such as photoresists. It is generally preferred that the absorption maximum of the sensitizer be matched to the intensity maximum of the source of actinic radiation. In general, the sensitizer will comprise about 0.01% to about 1.0% preferably about 0.05% to about 0.5% of the composition.

Substrates/Coating

The photopolymerizable compositions can be coated onto a wide variety of substrates. By "substrate" is meant any natural or synthetic support, preferably one which is capable of existing in a flexible or rigid form. For example, the substrate can be a metal sheet or foil, a sheet or film of synthetic organic resin, cellulose paper, fiberboard, and the like, or a composite of two or more of these materials.

The particular substrate will generally be determined by the intended application. For example, when printed circuits are produced, the substrate may be a plate which is a copper coating on fiberboard; in the preparation of of lithographic printing Plates, the substrate may be anodized aluminum. Specific substrates include alumina-blasted aluminum, anodized aluminum, alumina-blasted polyethylene terephthalate film, polyethylene terephthalate film, e.g., resin-subbed polyethylene terephthalate film, polyvinyl alcohol-coated paper, crosslinked polyester-coated paper, nylon, glass, cellulose acetate film, heavy paper such as lithographic paper, and the like.

The photopolymerizable layer may prepared by mixing the ingredients of the photopolymerizable composition in a solvent, such as dichloromethane, usually in the weight ratio of about 15:85 to 25:75 (solids to solvent), coating on the substrate, and evaporating the solvent. Coatings should be uniform. While the thickness of the layer will depend on the intended application, for dry film photoresists the coating should should have a thickness of about 0.2 to 4 mil (5 to 100 microns), preferably 0.5 to 2 mil (13 to 50 microns), when dry. For protection, a release film, such as polyethylene or polypropylene, may be placed over the photopolymerizable layer after the solvent evaporates.

Alternatively, since photopolymer compositions are quickly and efficiently coated onto polymer films using continuous web coating techniques, it may be convenient to coat the photopolymerizable composition onto a polymer film support, such as polyethylene terephthalate film, and laminate the resulting photopolymerizable layer to the substrate prior to exposure. The photopolymerizable layer may be protected until it is ready for use by, preferably, a release film, such as polyethylene or polypropylene, applied as the coated polymer film emerges from the drier. After removal of the release film, the photopolymerizable layer can then be laminated to the support. The polymer film support then acts as a coversheet which is removed after exposure.

Exposure/Image Formation

Any convenient source or sources of actinic radiation providing wavelengths in the region of the spectrum that overlap the absorption bands of the sensitizer can be used to activate photopolymerization. By "actinic radiation" is meant radiation which is active to produce the free-radicals necessary to initiate polymerization of the monomer(s). The radiation can be natural or artificial, monochromatic or polychromatic, incoherent or coherent, and for high efficiency should correspond closely to in wavelength to the absorption of the initiator system. Conventional light sources include fluorescent lamps, mercury, metal additive and arc lamps. Coherent light sources are xenon, argon ion, and ionized neon lasers, as well as tunable dye lasers and the frequency doubled neodymium:YAG laser, whose emissions fall within or overlap the visible absorption bands of the sensitizer.

For the exposure of holographic photopolymer systems coherent light sources, i.e., lasers, are required. Typically ion lasers, which have the required stability and coherence length but operate at a few lines of fixed wavelength, are used. With the development of photopolymer films that are sensitized across the visible spectrum, tunable lasers are required to match the broad spectral sensitivity of these materials. Since it is often desirable to record the hologram or holographic optical element (i.e., a hologram that acts as a diffraction grating, a mirror, a lens, or a combination of optical elements) with the same wavelength actinic radiation which will be used for reconstruction, tunable lasers offer added flexibility of recording a hologram and making a holographic optical element at any desired wavelength or at more than one selected wavelength.

In the preparation of holograms from the compositions disclosed in Haugh, U.S. Patent, 3,658,526; Keys, U.S. Pat. No. 4,942,102; Monroe, U.S. Pat. No. 4,942,112; Smothers, U.S. Pat. No. 4,959,284; and Trout, U.S. Pat. No. 4,963,471, the hologram may be fixed by a second, overall exposure to actinic radiation. If the hologram is a reflection hologram, in many cases the refractive index modulation of the hologram can be enhanced by heating to 100°–150° C. for about 0.5–1.5 hour following overall exposure.

Holographic Recording Systems

Holography differs from other image recording processes. Not only the amplitude, but also the phase, of the wave field which intercepts the photosensitive element is recorded. This is accomplished by introduction of a background wave, generally referred to as the reference beam. Interference between the reference beam and the wavefront reflected by the object whose image is to be recorded, generally referred to as object beam, converts phase differences into amplitude differences which can be recorded by photosensitive materials. The general principles are described in a number of references, for example, "Photography by Laser" by E. N. Leith and J. Upatnieks in *Scientific American*, 212 (6) 24–35 (June, 1965) and "Holography", by C. C. Guest, in *Encyclopedia of Physical Science and Technology*, Vol. 6, pp. 507–519, R. A. Meyers, Ed., Academic Press, Orlando, Fla. 1987.

Holograms that modulate the phase, rather than the amplitude, of the beam passing through them are usually referred to as phase holograms. Phase holographic image recording systems produce a spatial pattern of varying refractive index, rather than optical absorption, in the recording medium and, thus, can modulate without absorbing it. This type of refractive index image formation also includes a number of optical elements or devices, such as holographic lenses, gratings, mirrors, and optical waveguides, which superficially bear little resemblance to absorption images.

In making holograms, a photosensitive element comprising a recording medium is exposed to in phase beams of actinic coherent radiation. The intersecting beams interact to produce an interference pattern within the photosensitive element. This interference pattern is recorded in the photosensitive element as a series of interference fringes having varying refractive indices. Such holograms are known as volume holograms because the interference pattern is recorded in the depth, rather than on the surface, of the recording material.

If the beams enter the recoding medium from the same direction, a transmission hologram, so named because it may be viewed with transmitted light, is formed. Transmission holograms may be produced by methods which are well known in the art, such as disclosed in Leith and Upatnieks, U.S. Pat. Nos. 3,506,327; 3,838,903 and 3,894,787.

If the beams enter the recoding medium from opposite directions, a reflection hologram, so named because it may be viewed with reflected light, is formed. Reflection holograms may be produced by the on-axis method wherein a beam of actinic coherent radiation is projected through the photosensitive element onto an object, such as a diffractive optical element, therebehind. The radiation reflected by the object returns and interacts with the incident projected beam in the plane of the recording medium. Reflection holograms also may be produced by an off-axis method wherein a reference beam is projected on one side of the photosensitive element and an object beam is projected on the reverse side of the element. Reflection holograms produced by an off-axis process are disclosed in Hartman, U.S. Pat. No. 3,532,406.

A holographic mirror is the simplest possible reflection hologram. It can be created by splitting a single laser beam and recombining the beams at the recording medium, or the unsplit laser beam can be projected through the medium onto a plane mirror therebehind. A set of uniformly spaced fringes with a sinusoidal-like intensity distribution is formed that are oriented parallel to the bisector of the obtuse angle between the two beams propagating in the recording medium. If the obtuse angle is 180° and the beams are normal to the plane of the medium, the fringes will be parallel to the plane of the medium. The holographic mirror can be characterized by its wavelength of maximum reflection and by its reflection efficiency, that is the percent of incident radiation that is reflected at its wavelength of maximum reflection.

Industrial Applicability

The photopolymerizable compositions of this invention show good visible light sensitization that allows them to be exposed with a variety of visible light sources, especially lasers which emit in the longer wavelength region of the visible spectrum. These compositions are particularly useful in applications in which visible sensitivity is required, but it is desirable that no colored products remain to color the image following imaging.

Certain compositions of this invention are particularly useful for the formation of holograms in which sensitivity to visible lasers is required. In particular, the sensitizers used in the compositions of this invention are sensitive to actinic radiation in the red region of the visible spectrum and, when combined with a sensitizer or sensitizers which are sensitive to the actinic radiation in the blue and green regions of the visible spectrum, produce photopolymerizable compositions in which multiple holograms, generated by actinic radiation of different wavelengths, can be prepared. These holograms are particularly useful in the preparation of multicolor display holograms. They can also be used as holographic notch filters when it is desired to protect against one or more wavelengths of radiation.

The compositions of this invention may be used to form either precolored or toned colored images which can be used in pre-press color proofing. Such elements and processes are disclosed in, for example, Chu, U.S. Pat. No. 3,649,268; Fan, U.S. Pat. No. 4,053,310; Cohen, U.S. Pat. Nos. 4,174,216; Cohen 4,247,619; Taylor, 4,489,154; Taylor, 4,987,051; and U.S. patent application 07/475,056, filed Feb. 5, 1990, allowed 10/10/09. Other specific uses for the compositions of this invention as well as for the images, holograms, and multicolor holograms prepared therefrom will be evident to those skilled in the art.

The advantageous properties of this invention can be observed by reference to the following examples which illustrate, but do not limit, the invention.

EXAMPLES

| | GLOSSARY |
|---|---|
| CDM-HABI | 2-(o-chlorophenyl)-4,5-bis(m-methoxyphenyl)-imidazole dimer; CAS 29777-36-4 |
| o-Cl-HABI | 1,1'-Biimidazole, 2,2'-bis[o-chlorophenyl]-4,4',5,5'-tetraphenyl-; CAS 1707-68-2 |
| FC-430 | Fluorad ® FC-430; Fluoroaliphatic polymeric esters; CAS 11114-17-3; 3M Company, St. Paul, MN |
| FC-431 | Fluorad ® FC-431, liquid nonionic surfactant; 50% solution of fluoroaliphatic polymeric esters in ethyl acetate; .3M Company; St. Paul, MN |
| Fischer's Aldehyde | Acetaldehyde, (1,3-dihydro-1,3,3-trimethyl-2H-indol-2-ylidene)- |
| 9-JA | 9-Julolidine carboxaldehyde; 9-Carboxaldehyde, 2,3,6,7-tetrahydro-1H,5H-benzo[i,j]quinolizine; CAS 33985-71-6 |
| MMT | 4-Methyl-4H-1,2,4-triazole-3-thiol; CAS 24854-43-1 |
| NVC | N-Vinyl carbazole; 9-vinyl carbazole; CAS 1484-13-5 |
| Photomer ® 4039 | Phenol ethoxylate monoacrylate; CAS 56641-05-5; Henkel Process Chemical Company |
| Sartomer 349 | Ethoxylated bisphenol A diacrylate; CAS 24447-78-7; Sartomer Company, West Chester, PA |
| Sensitizer C-1 | JAW; Cyclopentanone, 2,5-bis[(2,3,6,7-tetrahydro-1H,5H-benzo[i,j]quinolizin-9-yl)methylene]-; CAS 125594-50-5; $\lambda_{max}$ 497 nm ($\epsilon$ 63,000) |
| Sensitizer C-2 | Cyclopentanone, 2,5-bis[(1,3-dihydro-1,3,3-trimethyl-2H-indol-2-ylidene)ethylidene]-; CAS 27713-85-5; $\lambda_{max}$ 520 nm ($\epsilon$ 103,000) |
| Sensitizer C-3 | Cyclopentanone, 2,5-bis[(3-ethyl-2(3H)-benzoxazolylidene)-ethylidene]-; $\lambda_{max}$ 515 nm ($\epsilon$ 126,000) |
| Sensitizer C-4 | Cyclopentanone, 2,5-bis[(3-ethyl-2(3H)-benzothiazolylidene)-ethylidene]-; CAS 27714-24-5; $\lambda_{max}$ 556 nm ($\epsilon$ 109,000) |
| Sensitizer S-1 | 4-Piperidinone, 2,6-bis[(2-(2,3,6,7-tetrahydro-1H,5H-benzo[i,j]-quinolizin-9-yl)methylidene]-; $\lambda_{max}$ 473 nm ($\epsilon$ 42,000) |
| Sensitizer S-2 | 4-Piperidinone, 4-ethyl-2,6-bis[(2-(2,3,6,7-tetrahydro-1H,5H-benzo[i,j]quinolizin-9-yl)-methylidene]-; $\lambda_{max}$ 471 nm ($\epsilon$ 52,000) |
| Sensitizer S-3 | 4-Piperidinone, 4-ethyl-2,6-bis[(2,3,6,7-tetrahydro-1H,5H-benzo[i,j]quinolizin-9-ylidene)-ethylidene]-; $\lambda_{max}$ 512 nm ($\epsilon$ 29,000) |
| Sensitizer S-4 | 4-Piperidinone, 4-ethyl-2,6-bis[(2-(1,3-dihydro-1,3,3-trimethyl-2H-indol-2-ylidene)ethylidene]-; $\lambda_{max}$ 502 nm ($\epsilon$ 82,000) |
| Sensitizer S-5 | 4-Piperidinone, 4-methyl-2,6-bis[(2-(1,3-dihydro-1,3,3-trimethyl-2H-indol-2-ylidene)ethylidene]-; $\lambda_{max}$ 503 nm ($\epsilon$ 99,000) |
| Sensitizer S-6 | 4-Piperidinone, 4-(1-methylethyl)-2,6-bis[(2-(1,3-dihydro-1,3,3-trimethyl-2H-indol-2-ylidene)-ethylidene]-; $\lambda_{max}$ 501 nm ($\epsilon$ 89,000) |
| Sensitizer S-7 | 4-Piperidinone, 4-benzoyl-2,6-bis-[(2-(1,3-dihydro-1,3,3-trimethyl-2H-indol-2-ylidene)ethylidene]-; $\lambda_{max}$ 504 nm |
| Sensitizer S-8 | 4-Piperidinone, 4-(phenylmethyl)-2,6-bis[(2-(1,3-dihydro-1,3,3-trimethyl-2H-indol-2-lidene)-ethylidene]-; $\lambda_{max}$ 504 nm ($\epsilon$ 103,000) |
| Sensitizer S-9 | 4-Piperidinone, 1-ethyl-3,5-bis[6,7,8,10-tetrahydro-10,10-dimethylpyrido[1,2-a]indol-9-yl)methylene]-; $\lambda_{max}$ 519 nm ($\epsilon$ 51,000) |
| Sensitizer S-10 | 4-Piperidinone, 4-ethyl-2,6-bis[2-(3-ethyl-2(3H)-benzoxazolylidene)-ethylidene]-; $\lambda_{max}$ 498 nm ($\epsilon$ 62,000) |
| Sensitizer S-11 | 4-Piperidinone, 4-ethyl-2,6-bis[2-(3-ethyl-2(3H)-benzothiazolylidene)ethylidene]-; $\lambda_{max}$ 537 nm ($\epsilon$ 106,000) |
| Sensitizer S-12 | 4-Piperidinone, 4-ethyl-2,6-bis[2-(1-ethylnaphtho[1,2-d]thiazol-2(1H)-ylidene)ethylidene]-; $\lambda_{max}$ 560 nm ($\epsilon$ 100,000) |
| TFE/VAc | Poly(tetrafluoroethylene/vinyl acetate) copolymer: (23:77 unless otherwise indicated) |
| Vinac ® B-100 | Poly(vinyl acetate); M.W. 350,000; CAS 9003-20-7; Air Products: Allentown, PA |

Absorption spectra were measured in dichloromethane.

-continued
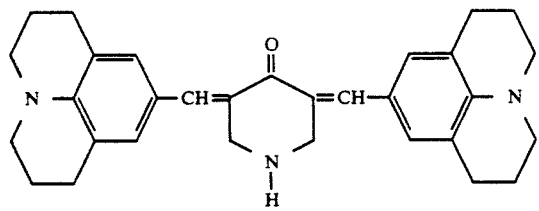
Sensitizer S-1
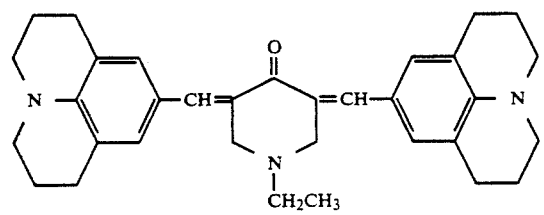
Sensitizer S-2
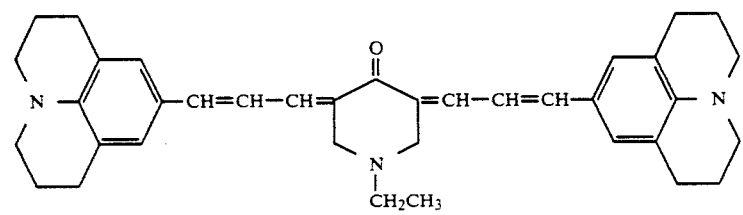
Sensitizer S-3
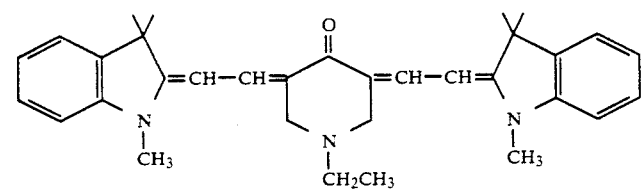
Sensitizer S-4
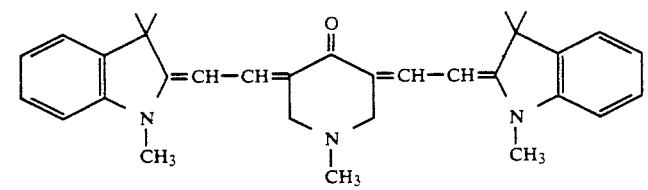
Sensitizer S-5
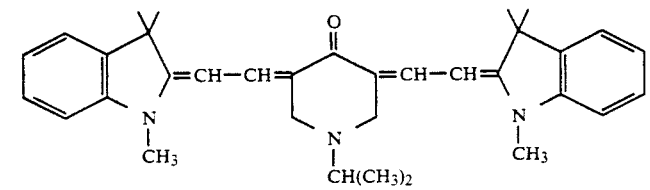
Sensitizer S-6

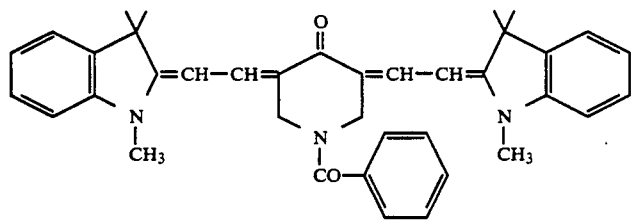
Sensitizer S-7
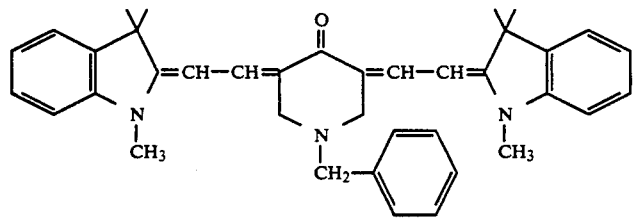
Sensitizer S-8
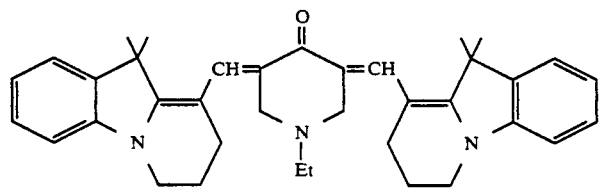
Sensitizer S-9
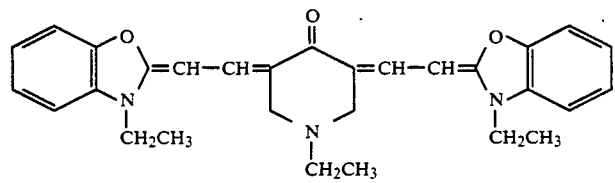
Sensitizer S-10
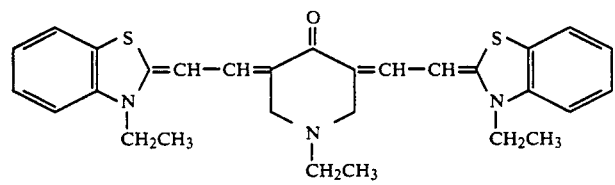
Sensitizer S-11
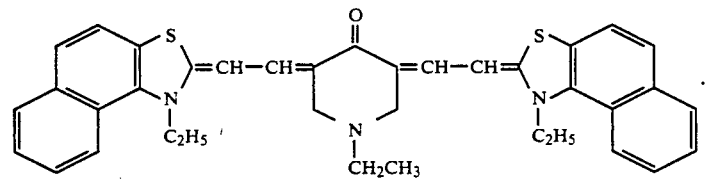
Sensitizer S-12
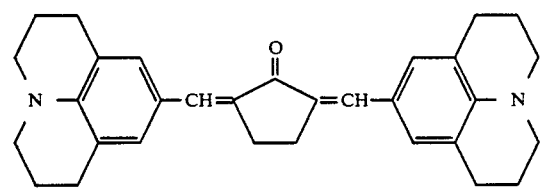

Sensitizer C-1
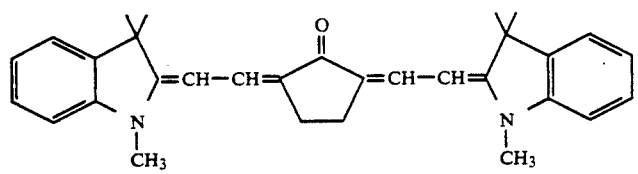
Sensitizer C-2
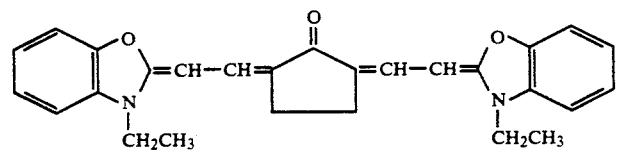
Sensitizer C-3
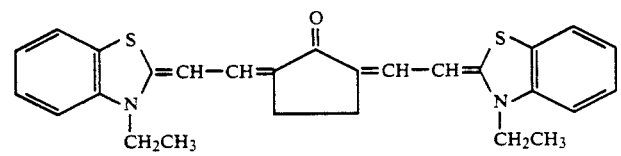
Sensitizer C-4
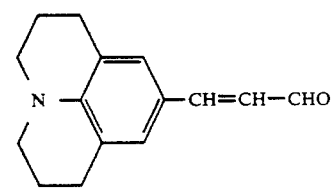
Compound I
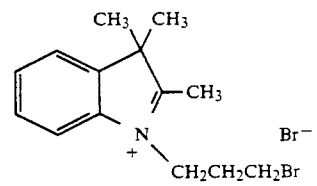
Compound II
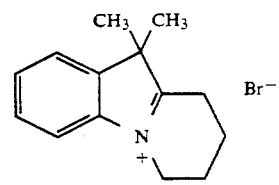
Compound III
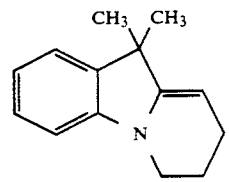
Compound IV -continued

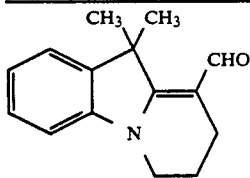

Compound V

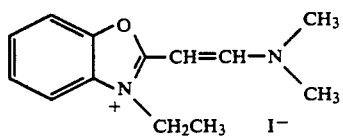

Compound VI

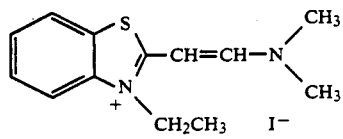

Compound VII

Syntheses

The sensitizers of this invention can be prepared by conventional synthetic procedures. Syntheses for sensitizers S-1, S-2, S-3, S-5, S-9, S-10, and S-11 are described below. Analogous syntheses can be used to prepare other sensitizers of this invention. The synthesis of substituted 1-methyl-3,5-dibenzylidene-4-piperidones by the base catalyzed condensation of 2 moles of the appropriate aldehyde with 1 mole of 1-methyl-4-piperidone is also described in N. J. Leonard and D. M. Locke, *J. Am. Chem. Soc.*, 77, 1852–1855 (1955).

A single step procedure for the synthesis of julolidine and substituted julolidines from aniline and from substituted anilines, respectively, is disclosed in H. Katayama, E. Abe, and K. Kaneko, *J. Hetercycl. Chem.*, 19, 925-6, 1982. In brief, aniline or a m- or p-substituted aniline is refluxed with 1,3-bromochloropropane in the presence of sodium carbonate. The water thus formed is removed by filtering the condensate from the reflux condenser through molecular sieves. The crude julolidines are purified as hydrobromide salts. An additional example of the synthesis of a substituted julolidine by this procedure is given in J. Van Gompel and G. B. Schuster, *J. Org. Chem.*, 52, 1465-8, 1987.

Julolidines can be formylated to their corresponding aldehydes by various conventional techniques. As an example of the formylation of a julolidine, the formylation of julolidine to 9-JA, is described in Monroe, U.S. Pat. No. 4,987,230. An example of the formylation of a substituted julolidine to its corresponding aldehyde using phosphorous oxychloride in N,N-dimethyl formamide is described in J. Van Gompel and G. B. Schuster, *J. Org. Chem.*, 52, 1465-8, 1987.

Sensitizer S-1: To a solution of 7.7 g (0.50 mol) 4-piperidone monohydrate hydrochloride and 20.0 g (0.099 mol) 9-JA in 80 mL of ethanol was added 9.1 g (0.114 mol) of 50% aqueous sodium hydroxide. The resulting reaction mixture was heated to reflux and held there for 25 hours. When the reaction mixture was cooled to room temperature, an amorphous solid separated. The mother liquor was decanted off. The solid was washed with methanol and dried in vacuo at 55° C. to give 19.4 g of crude product. The crude product was recrystallized by dissolving in 250 mL of warm dichloromethane, adding 1500 mL of ethyl acetate, and concentrating the resultant solution to 1000 mL by evaporation. The crystals obtained when this solution was chilled in ice were filtered, washed with ethyl acetate, and dried in vacuo at 55° C. to give 8.3 g of Sensitizer S-1 (36% yield); mp 201°–202° C.

Sensitizer S-2: To a solution of 7.0 g (0.106 tool) of 85% potassium hydroxide pellets in 650 mL of ethanol was added 100 g (0.498 tool) of 9-JA. The solution obtained was heated to reflux and 33.3 g (0.263 tool) of 1-ethyl-4-piperidone was added over a period of two hours. The reaction mixture was heated at reflux for three additional hour. An additional 6.7 g (0.052 mol) of 1-ethyl-4-piperidone was added and the reaction . mixture heated at reflux overnight. An additional 3.3 g (0.026 tool) of 1-ethyl-4-piperidone was added and the reaction heated at reflux overnight. The reaction mixture was cooled in an ice bath to precipitate product. The solids were filtered, washed with chilled ethanol, and dried in vacuo at 55° C. to give 58 g of Sensitizer S-2 (47% yield); mp 207°–209° C.

Sensitizer S-3: A solution of 25 g (0.145 tool) of julolidine in 170 mL of dichloromethane was chilled to −20° C. in a dry ice/acetone bath. Over a period of 20 minutes, 44.2 g (0.289 mol) of phosphorous oxychloride dissolved in 30 mL of dichloromethane was added, while reaction temperature was maintained between −15° and −20° C. To the resulting reaction mixture, 28.6 g (0.289 mol) of 3-(dimethylamino)acrolein was added dropwise over a period of 30 minutes, again keeping the reaction temperature between −15° and −20° C.

The reaction mixture was held at −15° to −20° C. for one hour and then allowed to warm to room temperature overnight. The UV/visible absorption spectrum of the reaction mixture showed an absorption band at 523 nm, corresponding to the N,N-dimethyl imine salt derivative of Compound I. Hydrolysis of the imine to Compound I was accomplished by adding 140 g (0.915 tool) of 10% sodium hydroxide to the reaction mixture chilled in ice and mixing the two phases intimately. The 523 nm absorption band was replaced by a new band at 411 nm corresponding to Compound I. The dichloromethane layer was separated, washed with water, and dried over anhydrous magnesium sulfate. Filtration and evaporation of the dichloromethane followed by recrystallization of the resulting crude product from methanol gave 13.0 g of Compound I (40% yield) as red crystals; mp 116°–118° C.

To a solution of 0.67 g (0.010 mol) of 85% potassium hydroxide in 55 mL of ethanol, was added 5.0 g (0.022 mol) of Compound I. The reaction mixture was heated to reflux and 1.45 g (0.011 mol) of 1-ethyl-4-piperidone was added over a period of one hour. The UV/visible spectrum of the reaction mixture had an absorption band at 518 nm with a shoulder at 422 nm. The reaction mixture was refluxed for an additional hour and the shoulder at 422 nm disappeared. The reaction mixture was chilled in an ice bath and held there for 30 minutes. The precipitate was filtered, washed with cold ethanol, dried in vacuo at 55° C. to give 2.8 g of Sensitizer S-3 (51% yield); mp 215°–217° C.

Sensitizer S-5: Fischer's alehyde, 20.1 g (0.010 mol) was added to a solution of 12.35 g (0.011 mol) of potassium tert-butoxide in 135 mL of tert-butyl alcohol and the resulting solution was heated to reflux. 1-Methyl-4-piperidone, 5.68 g (0.005 mol) was then added over a 15 minute period. The reaction mixture was heated at reflux for an additional three hours and cooled to room temperature. The precipitate was filtered, washed successively with water, methanol, and ether, and dried in vacuo at 55° C. to give 2.48 g of Sensitizer S-5 (10% yield); mp 147°–150° C.

Sensitizer S-9: A solution of 2,3,3-trimethyl-(3H)-indole, 51.5 g (0.324 tool), and 1,3-dibromopropane, 523 g (2.6 tool) was heated at 100° C. for 20 hours, during which time the reaction mixture partially solidified. The reaction mixture was then chilled in an ice bath and the solids broken up and filtered. The resulting wetcake was washed well with acetone and dried in vacuo at 55° C. By NMR the isolated product (60.2 g) was a mixture of two bromide salts (Compounds II and III).

The crude mixture of II and III, 49.6 g, was reacted with 39.0 g (0.30 mol) of N,N-diisopropylethylamine in 500 mL of absolute ethanol at reflux for 20 hours. The reaction mixture was cooled to room temperature and poured into 1000 mL of water and extracted three times with 300 mL portions of diethyl ether. The combined ether extracts were washed five times with 500 mL portions of water followed by 500 mL of saturated sodium chloride solution. The separated ether layer was dried over anhydrous sodium sulfate and evaporated to yield 29.5 g of a crude brown oil (Compound IV) that was sufficiently pure (by proton NMR) for use in the next synthetic step. The overall yield of IV for the two step sequence was 48%.

With care being taken to exclude moisture, 85 mL of N,N-dimethylformamide was chilled to between 0° and 5° C. and 13.8 g (0.090 tool) of phosphorus oxychloride added over a 15 minute period. Over a 15 minute period 15 g (0.075 mol) of Compound IV was added to the resulting solution while holding the temperature at 20° C. with an ice bath. The UV/visible absorption spectrum showed a band at 386 nm due to formation of the N,N-dimethyl imine salt derivative of Compound V. The reaction mixture was stirred at room temperature for one hour, during which time no further changes were observed in its absorption spectrum. The reaction mixture was then chilled in an ice bath and quenched with 80 mL of water, controlling the temperature of the exothermic reaction at 30° C. Potassium hydroxide (90 g) was slowly added as a 30% aqueous solution, and the temperature allowed to rise to about 40° C. The 386 nm absorption was replaced by a new band at 351 nm, due to Compound V.

After the reaction mixture was cooled to room temperature, it was extracted three times with 100 mL of dichloromethane. The combined dichloromethane extracts were then washed six times with 250 mL of water to remove the N,N-dimethylformamide and once with 100 mL of a saturated sodium chloride solution. The dichloromethane solution was dried over anhydrous sodium sulfate, filtered, and evaporated to give 15.2 g of brown solid. Recrystallization from ethanol/water gave 12.2 g of Compound V (71% yield) as maize colored crystals; mp 115°–117° C.

To a solution of 2.8 g (0.025 .tool) of potassium tert-butoxide in 40 mL of tert-butyl alcohol, was added 5.0 g (0.022 mol) of Compound V and the resulting solution was brought to reflux. Over a period of one hour, 1.4 g (0.011 mol) of 1-ethyl-4-piperidone was added and reflux was continued for 95 hours. Then 0.8 g (0.006 mol) of 1-ethyl-4-piperidone was added and reflux was continued for an additional 23 hours. The reaction was then cooled to room temperature and diluted with 40 mL of water to precipitate crude product as an amorphous solid from which the mother liquor was decanted. The crude product was dried in vacuo at 55° C. Purification of 1.0 g of this solid by flash chromatography on silica gel (acetone eluent) gave 0.36 g of Sensitizer S-9 (8% yield); mp 103°–106° C.

Sensitizer S-10: With care being taken to exclude moisture, 800 mL of N,N-dimethylformamide was chilled to between 0° and 5° C. and 65 g (0.425 mol) of phosphorous oxychloride was added over a 15 minute period. To the resulting solution was added 100 g (0.346 mol) of 3-ethyl-2-methylbenzoxazolium iodide. The reaction mixture was stirred at between 5° and 15° C. while 65 g (0.821 mol) of pyridine was added over a 45 minute period. The absorption spectrum of the reaction mixture showed an absorption band at 347 nm due to Compound VI.

The reaction mixture was warmed to room temperature and quenched with 80 mL of water, added over a period of 15 minutes. The temperature was controlled at 35° C. The reaction mixture was stirred for 30 minutes and a solution of 540 g (3.25 mol) of potassium iodide in 820 mL water was added over a 30 minute period to precipitate the product as its iodide salt. The temperature rose to 40° C. The resulting slurry was chilled in an ice bath, filtered, washed successively with ice water, cold methanol, and ether, and dried in vacuo at 55° C. to give 107.3 g of Compound IV (90% yield); mp 275°–276° C.

To a solution of 3.7 g (0.029 mol) of 1-ethyl-4-piperidone in 80 mL of tert-butyl alcohol, was added 20 g (0.058 mol) of Compound VI. The resulting mixture was heated to reflux under a blanket of nitrogen. Over a period of 30 minutes, 9.8 g (0.088 mol) of potassium tert-butoxide was added as a powder, with care taken to exclude moisture. An absorption band at 498 nm corresponding to Sensitizer S-10 appeared. After the reaction mixture was refluxed for two hours, no significant further change was observed in its spectrum. The reaction mixture was cooled to room temperature, diluted with 20 mL of water, and stirred for 30 minutes. The precipitate was filtered, washed well with water, ethanol, and ether, and dried in vacuo at 55° C. to give 4.55 g Sensitizer S-10 (33% yield); mp 156°-157° C.

Sensitizer S-11: To a solution of 3.5 g (0.028 tool) of 1-ethyl--4--piperidone in 80 mL of tert--butyl alcohol, was added 20 g (0.056 mol) of Compound VII. Compound VII can be prepared from 3-ethyl-2-methylbenzthiazolium iodide in a manner similar to Compound VI.

The resulting mixture was heated to reflux under a blanket of nitrogen. Over a period of one hour, 9.4 g (0.084 tool) of potassium tert-butoxide was added as a powder, with care taken to exclude moisture. The reaction mixture was heated at reflux for one hour, allowed to cool to room temperature, diluted with 20 mL of water, and stirred for one hour. The precipitate was filtered, washed well with water, ethanol, and ether, and dried in vacuo at 55° C. to give 8.7 .g of Sensitizer S-11 (64% yield); mp 180°-182° C.

GENERAL PROCEDURES

Sample Preparation

Coating solutions were prepared in amber bottles under dim light by adding solvent (85% of total solution by weight) and nonvolatile coating ingredients (15%) and mixing with a mechanical stirrer until the ingredients completely dissolved. The solvent was a mixture of dichloromethane (90% of total solvent by weight), 2-butanone (5%), and methanol (5%). All commercially available components were used as received.

Solutions were coated onto a support of 50 micron thick clear polyethylene terephthalate film at a speed of 4 cm/second using a Talboy web-coater equipped with a 100 micron or 200 micron doctor knife, 3.7 m drier set at 50°-70° C., and a laminator station. A coversheet of 25 micron polyethylene terephthalate or 25 micron polypropylene was laminated to the coatings as they exited the drier. Dry coating thickness ranged between 5.0 and 15 microns.

Sample Evaluation

Photobleaching

The absorbance ($A_0$) of fresh 2.5×2.5 cm samples of coated film was measured at the sensitizer's visible absorption maximum ($\lambda_{max}$) using a standard double beam spectrophotometer (Perkin Elmer model Lambda-9) scanning from 400 to about 600 nm. The sample was then removed from the spectrophotometer, exposed for 90 seconds to ultraviolet and visible light from a Theimer-Strahler #5027 mercury-arc photopolymer lamp (Exposure Systems Corp, Bridgeport, Conn.) mounted in a Douthitt DCOP-X exposure unit (Douthitt Corp, Detroit, Mich.), and the absorbance at $\lambda_{max}$ following bleaching (A) measured. Bleaching efficiency (%B) was calculated as:

$$\%B = [1-(A/A_0)] \times 100$$

Hologram Recording

To evaluate hologram recording capability, coated film was cut into 10×13 cm sections. The coversheet was removed and the film mounted by laminating the slightly tacky coating directly onto a clear glass plate. The support was left in place during handling, exposure, and thermal processing.

Coating samples mounted on glass plate were evaluated by recording a series holographic mirrors and determining hologram reflection efficiency as a function of exposure and wavelength. Holographic mirrors were formed by first tightly clamping the coating sampleplate between a clear glass coverplate and a front surface aluminized-glass mirror, with thin xylene layers between, and then exposing to a collimated 514 nm argon-ion laser beam oriented perpendicular to the film plane and passing, in order, through the glass coverplate, xylene layer, film support, coating, glass sampleplate, and xylene layer and then reflecting back onto itself off the mirror. The laser beam had a 2.0 cm diameter and an intensity of 10 mW/cm$^2$. A series of sixteen holographic mirrors were recorded, each at a separate non-overlapping position on the sampleplate, with the laser exposure time incrementally varied using a computer controlled shutter positioned in the laser beam. Exposure times varied from 0.11 to 20 seconds, corresponding to an exposure range of 1.1-200 mJ/cm$^2$. After completing the laser exposure series, the glass coverplate, aluminum mirror, and xylene layers were removed and the coating was overall exposed to ultraviolet and visible light as described above. The coating was then thermally processed by heating the sampleplate at 100°-120° C. for 60-65 minutes in a forced-air convection oven.

The transmission spectrum of each holographic mirror was then recorded as described above with the sample beam oriented perpendicular to the plane of the sampleplate. Maximum reflection efficiency and peak reflection wavelength for each holographic mirror was measured from their transmission spectra. Graphs of reflection efficiency at the peak reflection wavelength versus total laser exposure were used to determine photospeed, which was defined here as the minimum laser exposure required to obtain maximum holographic reflection efficiency.

COMPARATIVE EXAMPLES A-D

These examples demonstrate the photobleaching of Sensitizers C-1 to C-4 a photopolymerizable composition. Sensitizer C-1 is disclosed in Monroe, U.S. Pat. No. 4,987,230. Sensitizers C-2 and C-4 are disclosed in Smothers, U.S. Pat. No. 4,917,977. Sensitizer C-3 was prepared by synthetic procedures similar to those disclosed in Smothers, U.S. Pat. No. 4,917,977.

Coating solutions were prepared by dissolving 4.92 g of TFE/VAc (inherent viscosity 1.1 cp in THF); 1.28 g of Photomer ® 4039; 0.675 g of NVC; 0.225 g of Sartomer 349; 0.225 g of MMT; 0.150 g of o-Cl HABI; 0.0150 g FC-430; and sensitizer as indicated in Table 1 in a solvent mixture consisting of 38.25 g dichloromethane, 2.13 g methanol, and 2.13 g 2-butanone. The solutions were coated with a 100 micron doctor knife, dried, exposed to ultraviolet and visible light, and analyzed for bleaching efficiency as described above. Dry coating thickness ranged between 7 and 10 microns. Results are given in Table 1.

EXAMPLE 1

This example demonstrates the photobleaching of Sensitizer S-1 in a photopolymerizable composition.

A coating solution was prepared by dissolving 9.73 g of TFE/VAc (inherent viscosity 1.5 cp in THF); 2.70 g of Photomer ® 4039; monoacrylate 1.35g of NVC; 0.450 g of Sartomer 349; 0.375 g of MMT; 0.375 g of o-Cl HABI; and sensitizer S-1 as indicated in Table 1 in a solvent mixture consisting of 76.50 g dichloromethane, 4.25 g methanol, and 4.25 g 2-butanone. The solution was coated with a 200 micron doctor knife, dried, exposed to ultraviolet and visible light, and analyzed for bleaching efficiency as described above. Dry coating thickness was 15 microns. Results are given in Table 1.

EXAMPLES 2-9

These examples demonstrate the photobleaching of sensitizers of this invention in a photopolymerizable composition.

Coating solutions were prepared by dissolving 4.92 g of TFE/VAc (inherent viscosity 1.1 cp in THF); 1.28 g of Photomer ® 4039; monoacrylate 0.675 g of NVC; 0.225 g of Sartomer 349; 0.225 g of MMT; 0.150 g of o-Cl HABI; 0.0150 g FC-430; and sensitizer as indicated in Table 1 in a solvent mixture consisting of 38.25 g dichloromethane, 2.13 g methanol, and 2.13 g 2-butanone. The solutions were coated with a 100 micron doctor knife, dried, exposed to ultraviolet and visible light, and analyzed for bleaching efficiency as described above. Dry coating thickness ranged between 7 and 10 microns. Results are given in Table 1.

TABLE 1

| Example | Sensitizer | Amount (g) | %B[a] |
|---|---|---|---|
| Control A | C-1 | 0.015 | 47 |
| Control B | C-2 | 0.015 | 51 |
| Control C | C-3 | 0.015 | 70 |
| Control D | C-4 | 0.020 | 58 |
| 1 | S-1 | 0.036 | 81 |
| 2 | S-2 | 0.044 | 78 |
| 3 | S-4 | 0.015 | 90 |
| 4 | S-5 | 0.015 | 80 |
| 5 | S-6 | 0.015 | 91 |
| 6 | S-8 | 0.015 | 82 |
| 7 | S-10 | 0.015 | 87 |
| 8 | S-11 | 0.020 | 93 |
| 9 | S-12 | 0.062 | 80 |

[a]Percent bleaching at $\lambda_{max}$.

EXAMPLE 10

This example demonstrates the utility of Sensitizer S-1 in photopolymerizable compositions for hologram recording.

A coating solution was prepared by dissolving 9.73 g of TFE/VAc (inherent viscosity 1.5 cp in THF); 2.70 g of Photomer ® 4039; monoacrylate 1.35g of NVC; 0.450 g of Sartomer 349; 0.375 g of MMT; 0.375 g of o-Cl HABI; and sensitizer S-1 as indicated in Table 2 in a solvent mixture consisting of 76.50 g dichloromethane, 4.25 g methanol, and 4.25 g 2-butanone. The solution was coated with an 200 micron doctor knife, dried, and imaged to record a series of reflection holograms. The holograms were exposed to ultraviolet and visible light, heated at 120° C. for 60 minutes, and analyzed for reflection efficiency and photospeed as described above. Dry coating thickness was 15 microns. Results are given in Table 2.

EXAMPLES 11-19

These examples demonstrates the utility of Sensitizers S-2 to S-12 in polymerizable compositions for hologram recording.

Coating solutions were prepared by dissolving 4.92 g of TFE/VAc (inherent viscosity 1.1 cp in THF); 1.28 g of Photomer ® 4039; monoacrylate 0.675 gof NVC; 0.225 g of Sartomer 349; 0.225 g of MMT; 0.150 g of o-Cl HABI; 0.0150 g FC-430; and sensitizer as indicated in Table 2 in a so mixture consisting of 38.25 g dichloromethane, 2.13 g methanol, and 2.13 g 2-butanone. The solutions were coated with a 100 micron doctor knife, dried, and imaged to record a series of reflection holograms. The holograms were exposed to ultraviolet and visible light, heated at 100° C. for 60 minutes, and analyzed for reflection efficiency and photospeed as described above. Dry coating thickness ranged between 7 and 10 microns. Results are given in Table 2.

TABLE 2

| Ex. | Sensitizer | Amount (g) | Photospeed (mJ/cm$^2$) | Maximum RI[a] (%) | Wavelength (nm) |
|---|---|---|---|---|---|
| 10 | S-1 | 0.036 | 18 | 99.9 | 504 |
| 11 | S-2 | 0.044 | 25 | 98.8 | 500 |
| 12 | S-4 | 0.015 | 20 | 98.5 | 502 |
| 13 | S-5 | 0.015 | 20 | 99.0 | 501 |
| 14 | S-6 | 0.015 | 20 | 98.0 | 503 |
| 15 | S-7 | 0.053 | 25 | 98.7 | 502 |
| 16 | S-8 | 0.015 | 18 | 98.9 | 501 |
| 17 | S-10 | 0.015 | 20 | 99.4 | 503 |
| 18 | S-11 | 0.020 | 50 | 98.9 | 502 |
| 19 | S-12 | 0.062 | 50 | 98.4 | 504 |

[a]Reflection efficiency at the wavelength of maximum reflection.

EXAMPLES 20-21

These examples demonstrates the utility of Sensitizers S-3 and S-9 in photopolymerizable compositions for hologram recording.

Coating solutions were prepared by dissolving 5.89 g of TFE/VAc (22/78 wt%, inherent viscosity 0.987 cp in THF); 1.53 g of Photomer ® 4039; monoacrylate 0.810 g of NVC; 0.270 g of Sartomer 349; 0.270 g of MMT; 0.180 g o-Cl HABI; 0.0180 g FC-430; and sensitizer as indicated In Table 2 in a solvent mixture consisting of 45.9 g dichloromethane, 2.55 g methanol, and 2.55 g 2-butanone. The solutions were coated with a 100 micron doctor knife, dried, and imaged to record a series of reflection holograms. The holograms were overall exposed, processed, and analyzed as described in Example 11. Dry coating thickness ranged between 5 and 6 microns. Results are given in Table 3.

TABLE 3

| Ex. | Sensitizer | Amount (g) | Photospeed (mJ/cm$^2$) | Maximum RI[a] (%) | Wavelength (nm) |
|---|---|---|---|---|---|
| 20 | S-3 | 0.045 | 200 | 98.4 | 505 |
| 21 | S-9 | 0.031 | 30 | 97.6 | 510 |

[a]Reflection efficiency at the wavelength of maximum reflection.

EXAMPLE 22

This example demonstrates the use of Sensitizer S-1 with triazine initiator and borate coinitiator.

A coating solution was prepared by dissolving 8.24 g of TFE/VAc (21:79 wt%, inherent viscosity 0.92 cp in THF); 2.16 g of Photomer 4039; 1.08 g of NVC; 0.36 g of Sartomer 349; 0.090 g of 2,4,6-tris(trichloromethyl)-1,3,5-triazine; 0.024 g of tetramethylammonium triphenylbutylborate; 0.024 g FC-430; and 0.024 g of Sensitizer S-1 in a solvent mixture consisting of 64.6 g dichloromethane and 3.4 g of 2-butanone. Dry coating thickness was 16 microns. The solution was coated with an 8-mil (200 micron) doctor knife, dried, and imaged to record a series of reflection holograms as described above. The holograms were then exposed to ultraviolet and visible light, heated at 100° C. for 60 min, and ana- Having described the invention, we now claim the following and their equivalents.

What is claimed is:

1. A compound suitable for use as a photobleachable sensitizer having the following structure:

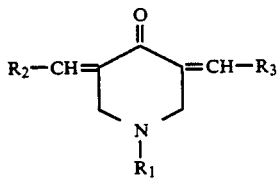

wherein

R₁ is (1) hydrogen, (2) substituted or unsubstituted alkyl of 1 to 8 carbon atoms, or (3) $R_{15}CO—$, where $R_{15}$ is a substituted or unsubstituted aryl or heteroaryl of 5 to 10 atoms or a substituted or unsubstituted alkyl of 1 to 8 carbon atoms; and $R_2$ and $R_3$, alike or different, are selected from the group consisting of:

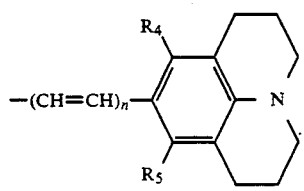

(I)

wherein
n is 0 or 1;
$R_4$ and $R_5$ are each independently hydrogen, hydroxyl, halogen, alkyl of 1 to 6 carbon atoms, and alkoxyl of 1 to 6 carbon atoms; and

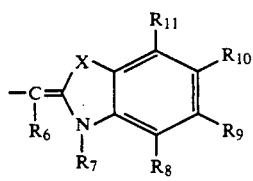

(II)

wherein:
X is O, S, Se, $NR_{12}$, or $CR_{13}R_{14}$, where $R_{12}$, $R_{13}$, and $R_{14}$ are each independently alkyl of 1 to 6 carbon atoms or substituted or unsubstituted phenyl;
$R_6$ is hydrogen or substituted or unsubstituted alkyl of 1 to 4 carbon atoms;
$R_7$ is (1) substituted or unsubstituted alkyl or cycloalkyl of 1 to 8 carbon atoms or (2) substituted or unsubstituted aryl or heteroaryl of 5 to 10 atoms; or
$R_6$ and $R_7$ are joined together to form a 5- to 7-membered substituted or unsubstituted heterocyclic ring;
$R_8$, $R_9$, $R_{10}$, and $R_{11}$ each independently hydrogen, halogen, dialkylamino, substituted or unsubstituted alkyl or cycloalkyl of 1 to 6 carbon atoms, or substituted or unsubstituted alkoxyl of 1 to 6 carbon atoms; or ($R_8$ and $R_9$), ($R_9$ and $R_{10}$), or ($R_{10}$ and $R_{11}$) are joined in a substituted or unsubstituted aromatic ring of 5 to 10 atoms.

2. The compound of claim 1 wherein $R_1$ is hydrogen, alkyl of 1 to 7 carbon atoms, or $R_{15}CO—$, where $R_{15}$ is alkyl of 1 to 8 carbon atoms or substituted or unsubstituted phenyl; n is 0; $R_4$ and $R_5$ are each hydrogen; X is $C(CH_3)_2$, O or S; $R_6$ is hydrogen or methyl and $R_7$ is an alkyl group of 1 to 4 carbon atoms, or $R_6$ and $R_7$ are joined to form a 6-membered heterocyclic ring; and $R_8$, $R_9$, $R_{10}$, and $R_{11}$ each independently hydrogen, halogen, alkyl of 1 to 4 carbon atoms, or alkoxyl of 1 to 4 carbon atoms; or ($R_8$ and $R_9$), ($R_9$ and $R_{10}$), or ($R_{10}$ and $R_{11}$) are joined to form an aromatic ring of 6 carbon atoms.

3. The compound of claim 1 wherein $R_2$ and $R_3$ are the same.

4. The compound of claim 3 wherein $R_1$ is hydrogen, alkyl of one to seven carbon atoms, or $R_{15}CO—$, where $R_{15}$ is alkyl of 1 to 8 carbon atoms or substituted or unsubstituted phenyl.

5. The compound of claim 4 wherein $R_2$ and $R_3$ are equal to Structure I.

6. The compound of claim 5 wherein n is 0.

7. The compound of claim 6 wherein $R_4$ and $R_5$ are hydrogen.

8. The compound of claim 4 wherein $R_2$ and $R_3$ are equal to Structure II.

9. The compound of claim 8 wherein X is $C(CH_3)_2$.

10. The compound of claim 9 wherein $R_6$, $R_8$, $R_9$, $R_{10}$, and $R_{11}$ are the same and equal to hydrogen and $R_7$ is alkyl of 1 to 4 carbon atoms.

11. The compound of claim 9 wherein $R_6$ and $R_7$ are joined to form a 6-membered heterocyclic ring and $R_8$, $R_9$, $Ri0$ and $R_{11}$ are the same and equal Co hydrogen.

12. The compound of claim 6 wherein X is O.

13. The compound of claim 12 wherein $R_6$, $R_8$, $R_9$, $R_{10}$, and $R_{11}$ are the same and equal to hydrogen and $R_7$ is alkyl of 1 to 4 carbon atoms.

14. The compound of claim 8 wherein X is S.

15. The compound of claim 14 wherein $R_6$, $R_8$, $R_9$, $R_{10}$, and $R_{11}$ are the same and equal to hydrogen and $R_7$ is alkyl of 1 to 4 carbon atoms.

16. The compound of claim 14 wherein $R_6$, $R_{10}$, and $R_{11}$ are the same and equal to hydrogen, $R_7$ is alkyl of 1 to 4 carbon atoms, and $R_8$ and $R_9$ are joined to form a 6-membered aromatic ring.

* * * * *